United States Patent
Ta et al.

(10) Patent No.: US 6,608,512 B2
(45) Date of Patent: Aug. 19, 2003

(54) FULL RAIL DRIVE ENHANCEMENT TO DIFFERENTIAL SEU HARDENING CIRCUIT

(75) Inventors: Theodore T. Ta, Plymouth, MN (US); Keith W. Golke, Minneapolis, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/034,808

(22) Filed: Dec. 28, 2001

(65) Prior Publication Data

US 2003/0122602 A1 Jul. 3, 2003

(51) Int. Cl.⁷ ............................................. H03K 3/037
(52) U.S. Cl. ........................ 327/211; 327/199; 327/218
(58) Field of Search ............................. 327/55, 57, 211, 327/212, 215, 199, 201, 218

(56) References Cited

U.S. PATENT DOCUMENTS

| | | | |
|---|---|---|---|
| 4,638,463 A | * 1/1987 | Rockett, Jr. | 365/205 |
| 4,852,060 A | * 7/1989 | Rockett, Jr. | 365/154 |
| 4,912,675 A | 3/1990 | Blake et al. | 365/154 |
| 5,111,429 A | * 5/1992 | Whitaker | 365/154 |
| 5,504,703 A | * 4/1996 | Bansal | 365/156 |
| 6,058,041 A | 5/2000 | Golke et al. | 355/156 |
| 6,275,080 B1 | * 8/2001 | Phan et al. | 327/210 |

OTHER PUBLICATIONS

Hazucha et al., "Single event upset hardened latch", Publication No. 2001/0054923 Dec. 27, 2001, application No. 09/472,000 filed Dec. 23, 1999.*

Calin et al., "Upset Hardened Memory Design for Submicron CMOS Technology", IEEE Transactions on Nuclear Science, vol. 43, No. 6, Dec. 1996, pp. 2874–2878.

* cited by examiner

*Primary Examiner*—Toan Tran
(74) *Attorney, Agent, or Firm*—Schiff Hardin & Waite

(57) ABSTRACT

A hardening circuit is provided for an integrated circuit which includes a data state reinforcing feedback path having a data node Q and a data complement node QN. A first hardening transistor is coupled between a rail and the data node Q, and a second hardening transistor coupled between the rail and the data complement node QN. The first and second hardening transistors provide additional drive to the data node Q and the data complement node QN. Gate controls operate the first and second hardening transistors and provide full rail drive to SEU sensitive nodes.

53 Claims, 7 Drawing Sheets

FULL RAIL DRIVE ENHANCEMENT TO DIFFERENTIAL SEU HARDENING CIRCUIT

TECHNICAL FIELD OF THE INVENTION

The present invention is directed to the hardening of integrated circuits against single event upsets. These hardened integrated circuits, for example, may be used for data storage.

BACKGROUND OF THE INVENTION

Integrated circuits are frequently used in the presence of radiation. Radiation, which can be in the form of x-rays, gamma-rays, photons, or particles, deposit charge in silicon and, therefore, can cause upsets in the integrated circuits. The most common upset causes are from such particles as protons, neutrons, and heavy ions. As a result of such radiation, charges can be collected at circuit nodes that send the nodes to opposite voltage states (e.g., from high to low). When this voltage state change happens to a data storage circuit, the data storage nodes change to the opposite data states. All circuits can tolerate some amount of deposited charge that does not cause a data state change. However, all circuits also have some deposited charge threshold above which the data state will be changed. This threshold is referred to as the critical charge (i.e., Qcrit) for upset. Such data state changes are defined as radiation induced upsets. When radiation particles, which are particles that are discrete in time and space, cause a data upset, the data upset is referred to as a single event upset (SEU).

For a circuit node to collect charge, a particle must penetrate the silicon region coupled to that node, and the particle must also pass through, or be close to, a voltage gradient. Charge is only collected from silicon regions where the time that the charge drifts or diffuses into a voltage gradient is greater than the recombination time. An shown in FIG. 1, a portion of an integrated circuit 10 includes a reverse biased pn junction 12 such as found on the drain of an off n-channel transistor (an n-channel transistor in an off state) that is being driven high by a p-channel transistor.

As shown in FIG. 1, a particle passes along track #1 through the n-channel drain pn junction and depletion region. As a result, hole-electron pairs are generated along the entire length of track #1. The number of such generated hole-electron pairs is dependent on the mass and energy of the particle.

In the N+ region shown in FIG. 1, the concentration of impurities is typically so high that lifetimes are very short. Therefore, the generated hole-electron pairs in the N+ region recombine before they can move.

In the depletion region, however, there is an electric field that quickly separates the holes and electrons, sending the holes to the P− region and the electrons to the N+ region before they can recombine. Charge that moves under the influence of an electric field is known as drift current. The holes and electrons are majority carriers in these regions and, therefore, create a current that discharges the V+ node and charges the ground node.

In the P− region, lifetimes are much longer than in the N+ region. Therefore, there is time for the holes and electrons to diffuse away from the particle track. The movement of charge from regions of high concentration to regions with lower charge concentration is known as diffusion current. Some holes and electrons diffuse toward the depletion region. The electrons diffusing toward the depletion region accelerate across and into the N+ region. However, the holes diffusing toward the depletion region are thrown back into the P− region.

Accordingly, the particle moving along track #1 creates a sudden discharge current on the V+ node. If the amount of collected charge is large enough to overcome the capacitance and V+ drive at this portion of the integrated circuit 10 (i.e., the p-channel transistor does not have sufficient drive to prevent the V+ node from discharging to ground), and if this node is part of a feedback path, then the particle moving along track #1 could result in a change of (i.e., an error in) the stored data state. If the data state does change, this change is known as a SEU (single event upset).

Likewise, a reverse biased pn junction such as found on the drain of an off p-channel transistor being driven by an n-channel transistor can experience a similar charging current from a particle passing through it.

The time that it takes the radiation particle to traverse the depletion region and generate the hole-electron pairs is on the order of a picosecond, which is much shorter than typical system operating frequencies. The time that it takes the charge to traverse the depletion region is also on the order of picoseconds. Lifetimes in the P− region are much longer. Thus, the nature of the current produced by a radiation particle traversing a reverse biased pn junction begins as a large current pulse of short duration (the charge deposited in the depletion region traversing this depletion region, i.e., drift current). This pulse is followed by a much smaller current of longer duration (the charge deposited outside the depletion region diffusing to the depletion region, i.e., diffusion current, and then traversing the depletion region). Generally, it is the initial large current pulse to which a data storage circuit is most vulnerable. Thus the stored data state disturbing current produced by a radiation particle is a transient phenomena that occurs in a time much smaller than operating frequencies.

Because the data state of a node upset by a radiation particle passing through it can be restored by rewriting the original stored data state, the change in state of the upset node is known as a soft error. There is a time and spatial distribution of particles that have a range of mass and energy. An upset can only be predicted in terms of the probability (i.e., rate) of a particle with sufficient mass and energy to traverse a depletion region with a sufficiently long track length of deposited charge that exceeds Qcrit. The rate at which these soft errors occur is known as the soft error rate (SER). The SER is proportional to the volume of the sensitive region and is inversely proportional to Qcrit.

If the N+ region in FIG. 1 is at ground instead of at V+ as shown, there is no reverse biased depletion region. Instead, there is only the space charge region typically associated with the built-in pn junction potential of 0.7V. At least in some respects, the behavior of the node with a grounded N+ region is similar to the reverse biased conditions described above. That is, when a particle passes through the space charge region of this node whose N+ region is grounded, the deposited charge discharges the N+ node. However, when the grounded N+ region discharges to −0.7V, the pn junction becomes forward biased, and holes consequently sweep into the N+ region to recombine with the electrons that were initially swept into the N+ region.

Thus, the maximum voltage change for the N+ region of this node is −0.7V, which actually is a harder low state on the node. Accordingly, a radiation particle passing along track #1 of FIG. 1, where the N+ region is grounded, cannot create an SEU. Likewise, a P+/N− junction where both sides are high at VDD will only go to VDD +0.7V when a particle strikes the space charge region.

Therefore, as can be seen, there must be a reverse biased condition in order for an SEU to occur.

A radiation particle moving along track #2 shown in FIG. 1 also creates hole-electron pairs along the track, and these hole-electron pairs can diffuse into the depletion region. However, the diffusion process is much slower than the drift process corresponding to particle track #1. Therefore, a smaller current corresponding to particle track #2 is created compared to the current corresponding to particle track #1. Therefore, SEUs are created primarily by particles passing through the depletion region. As a result, the depletion region defines the sensitive volume for an SEU. (The sensitive volume for charge collection is the region from which a node collects charge.)

In bulk silicon technology, the depletion region of a node is principally the region under the drain. Therefore, the sensitive volume is also principally the region under the drain. There also are depletion regions surrounding the drain and under the gate, but these regions are generally small compared to the region under the drain. Therefore, the sensitive volume in bulk silicon technology is the drain region.

In SOI (Silicon On Insulator) technology, there is no depletion region under the drain. There is a depletion region under the gate, and there may or may not be a depletion region around the remaining sides of the drain. Therefore, the sensitive volume in SOI technology is generally the gate region, but may also include some additional perimeter of the drain.

FIG. 2 shows an off SOI n-channel transistor 14 with a particle track #1 passing through a depletion region 16 under the gate of the SOI n-channel transistor 14 and a particle track #2 passing through a drain perimeter depletion region 18 extending out from the non-gate perimeter of the drain of the SOI n-channel transistor 14. Both of these tracks introduce charge to the V+ node in the same manner as described above.

In addition, SOI devices are especially vulnerable to an additional current flow mechanism that can be triggered by a particle. This additional flow mechanism can be understood with reference to FIG. 2. Particle track #1 shown in FIG. 2 passes through the silicon region under the gate (i.e., transistor substrate node) of the SOI n-channel transistor 14. The depletion region 16 moves electrons to the drain N+ region and holes oppositely into the P− region under the gate. The V+ node collects the electrons, but the holes continue to collect in the P− region under the gate. This hole collection raises the P− voltage until a pn junction forward bias occurs with the source region.

Moreover, the MOSFET source/substrate/drain structure is also a parasitic NPN bipolar structure, where the source is the emitter of the bipolar structure, where the substrate is the base of the bipolar structure, where the drain is the collector of the bipolar structure, and where the base/emitter junction is forward biased by the collection of charge as described above. This forward biasing creates a collector current that is equal to the base current (which is created by the charge deposited by a particle strike) times the gain of the parasitic bipolar transistor (parasitic BJT). Accordingly, the drain current is greater than can be directly attributed to the hole-electron pairs generated by the particle.

This additional current flow must be avoided in order to avoid an upset. Therefore, it is important to sweep the accumulating holes in the P− region out directly to the ground node as shown in FIG. 3. However, even in this case, there is a resistance associated with the P− region such that the resulting IR drop could still result in a forward bias of the substrate/source junction.

FIG. 3 is a top view of the transistor shown in FIG. 2. As shown in FIG. 3, the P− substrate is coupled directly to ground. Arrows show the resulting hole-electron movement. However, there is resistance in the P− substrate region through which the holes move that will create an IR drop. This resistance must be kept low enough to prevent the IR drop from forward biasing the substrate/source junction.

SEU hardening of integrated circuits have been implemented to prevent single event upsets. Generally, two methods have been used to implement SEU hardening of data storage circuits (i.e. memory cells, latches, flip-flops, registers, etc.). In the first method, logic is added to the integrated circuit. However, this first method has significantly increased area, delay, and power. In the second method, RC delay (usually involving one or two resistors whose resistance is in the neighborhood of 10,000 ohms to more than 100,000 ohms) has been added to the feedback path in the integrated circuit. However, the second method places a large RC delay in the write path of the integrated circuit, thereby increasing delay. The second method also requires additional processing for the dedicated resistive element(s).

The present invention achieves SEU hardening without additional processing, without significantly increasing delay and power, and without increasing sensitivity to SEUs.

SUMMARY OF THE INVENTION

In accordance with one aspect of the present invention, a hardening system comprises a data storage device and a hardening circuit. The data storage device has a data input, a clock input, and a data state reinforcing feedback path having a data node Q and a data complement node QN, and the data storage device provides drive to the data node Q and the data complement node QN. The hardening circuit is coupled to the data state reinforcing feedback path, and the hardening circuit provides extra drive to the data node Q and the data complement node QN so as to prevent the data node Q and the data complement node QN from changing states in the presence of radiation. The hardening circuit provides full rail drive to internal nodes of the hardening circuit.

In accordance with another aspect of the present invention, a hardening circuit for an integrated circuit having a data state reinforcing feedback path with a data node Q and a data complement node QN comprises first and second hardening transistors and first and second gate control circuits. The first hardening transistor is coupled between a rail and the data node Q, and the first hardening transistor is arranged to provide additional drive to the data node Q. The second hardening transistor is coupled between the rail and the data complement node QN, and the second hardening transistor is arranged to provide additional drive to the data complement node QN. The first gate control circuit is coupled between a clock input and a gate of the first hardening transistor, the first gate control circuit includes first and second transistor paths each having a control input, the control input of the first transistor path is coupled to the data node Q, and the control input of the second transistor path is coupled to the data complement node QN. The second gate control circuit is coupled between the clock input and a gate of the second hardening transistor, the second gate control circuit includes third and fourth transistor paths each having a control input, the control input of the third transistor path is coupled to the data complement node QN, and the control input of the fourth transistor path is coupled to the data node Q. The first and second gate control circuits provide full rail drive to internal nodes of the hardening circuit.

In accordance with still another aspect of the present invention, a hardening system comprises a positive-level-sensitive D latch, first and second p-channel hardening transistors, and first and second gate control circuits. The positive-level-sensitive D latch has a data input, a clock input, and a data state reinforcing feedback path having a data node Q and a data complement node QN, and the positive-level-sensitive D latch is coupled between rails VDD and VSS. The first p-channel hardening transistor is coupled between the rail VDD and the data node Q, and the first p-channel hardening transistor provides drive to the data node Q in addition to drive provided by the positive-level-sensitive D latch. The second p-channel hardening transistor is coupled between the rail VDD and the data complement node QN, and the second p-channel hardening transistor is arranged to provide drive to the data complement node QN in addition to drive provided by the positive-level-sensitive D latch. The first gate control circuit is coupled between the clock input and a gate of the first p-channel hardening transistor, the first gate control circuit includes a first n-channel transistor path and a first p-channel transistor path each having a control input, the control input of the first n-channel transistor path is coupled to the data node Q, and the control input of the first p-channel transistor path is coupled to the data complement node QN. The second gate control circuit is coupled between the clock input and a gate of the second p-channel hardening transistor, the second gate control circuit includes a second n-channel transistor path and a second p-channel transistor path each having a control input, the control input of the second p-channel transistor path is coupled to the data node Q, and the control input of the second n-channel transistor path is coupled to the data complement node QN. The first and second gate control circuits provide full rail drive to the internal nodes of the hardening system.

In accordance with yet another aspect of the present invention, a hardening system comprises a negative-level-sensitive D latch, first and second n-channel hardening transistors, and first and second gate control circuits. The negative-level-sensitive D latch has a data input, a clock input, and a data state reinforcing feedback path having a data node Q and a data complement node QN, and the negative-level-sensitive D latch is coupled between rails VDD and VSS. The first n-channel hardening transistor is coupled between the rail VDD and the data node Q, and the first n-channel hardening transistor is arranged to provide drive to the data node Q in addition to drive provided by the negative-level-sensitive D latch. The second n-channel hardening transistor is coupled between the rail VDD and the data complement node QN, and the second n-channel hardening transistor is arranged to provide drive to the data complement node QN in addition to drive provided by the negative-level-sensitive D latch. The first gate control circuit is coupled between the clock input and a gate of the first n-channel hardening transistor, the first gate control circuit includes a first n-channel transistor path and a first p-channel transistor path each having a control input, the control input of the first n-channel transistor path is coupled to the data complement node QN, and the control input of the first p-channel transistor path is coupled to the data node Q. The second gate control circuit is coupled between the clock input and a gate of the second n-channel hardening transistor, the second gate control circuit includes a second n-channel transistor path and a second p-channel transistor path each having a control input, the control input of the second p-channel transistor path is coupled to the data complement node QN, and the control input of the second n-channel transistor path is coupled to the data node Q. The first and second gate control circuits provide full rail drive to the internal nodes of the hardening system.

BRIEF DESCRIPTION OF THE DRAWINGS

These and other features and advantages will become more apparent from a detailed consideration of the invention when taken in conjunction with the drawings in which.

DETAILED DESCRIPTION

The hardening circuit of the present invention is coupled to the data true and data complement nodes of a data state reinforcing feedback path in a data storage element in order to be effective. In the following circuit description, these nodes are referred to as the nodes Q and QN. Therefore, as a matter of convenience only, all of the descriptions below relating to connections between the data storage device and the hardening circuit will reference the nodes Q and QN.

Figure 1:
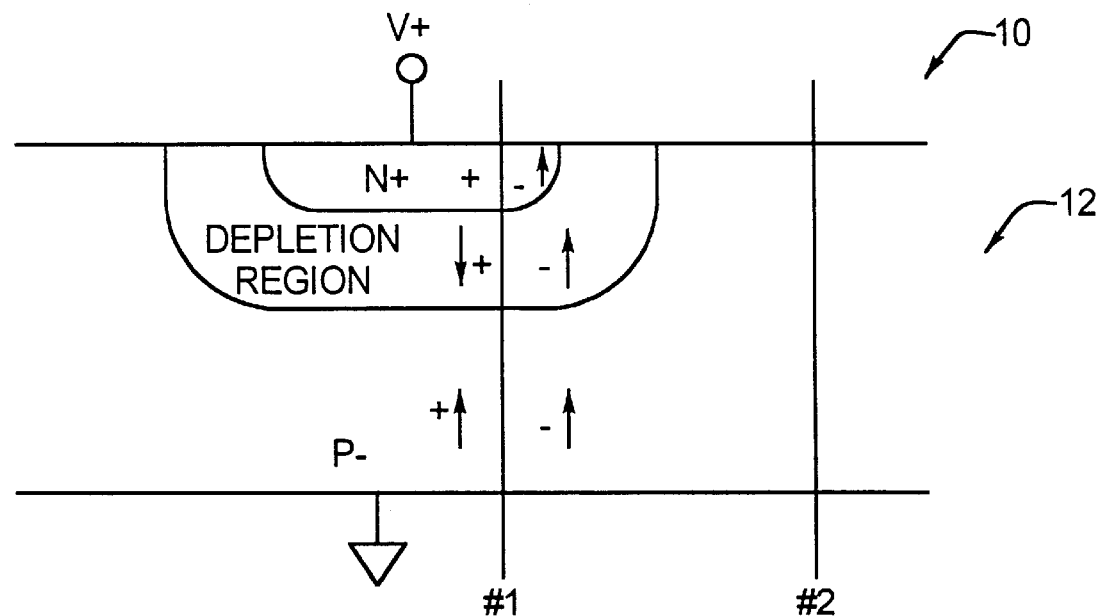
FIG. 1 illustrates movement through a reverse biased pn junction of the holes and electrons generated from a particle passing through the silicon of a transistor.
Figure 2:
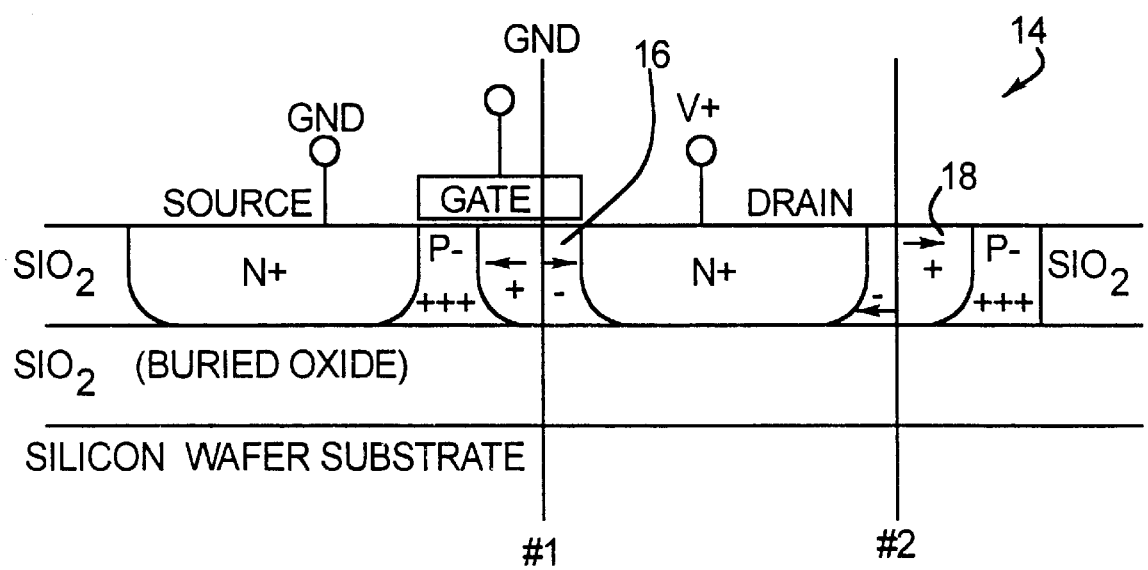
FIG. 2 shows a particle track #1 through a depletion region under the gate of an off SOI n-channel transistor and a particle track #2 through a depletion region at the non-gate perimeter of the drain of the off SOI n-channel transistor.
Figure 3:
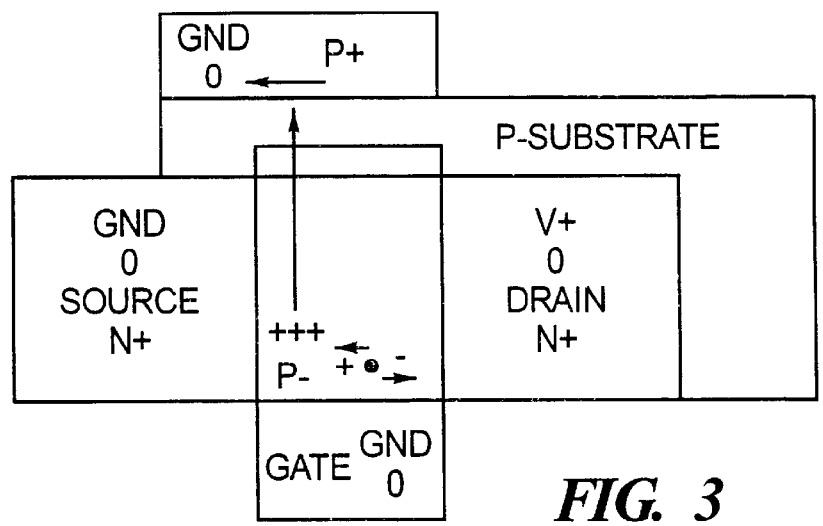
FIG. 3 is a top view of the transistor shown in FIG. 2.
Figure 5:
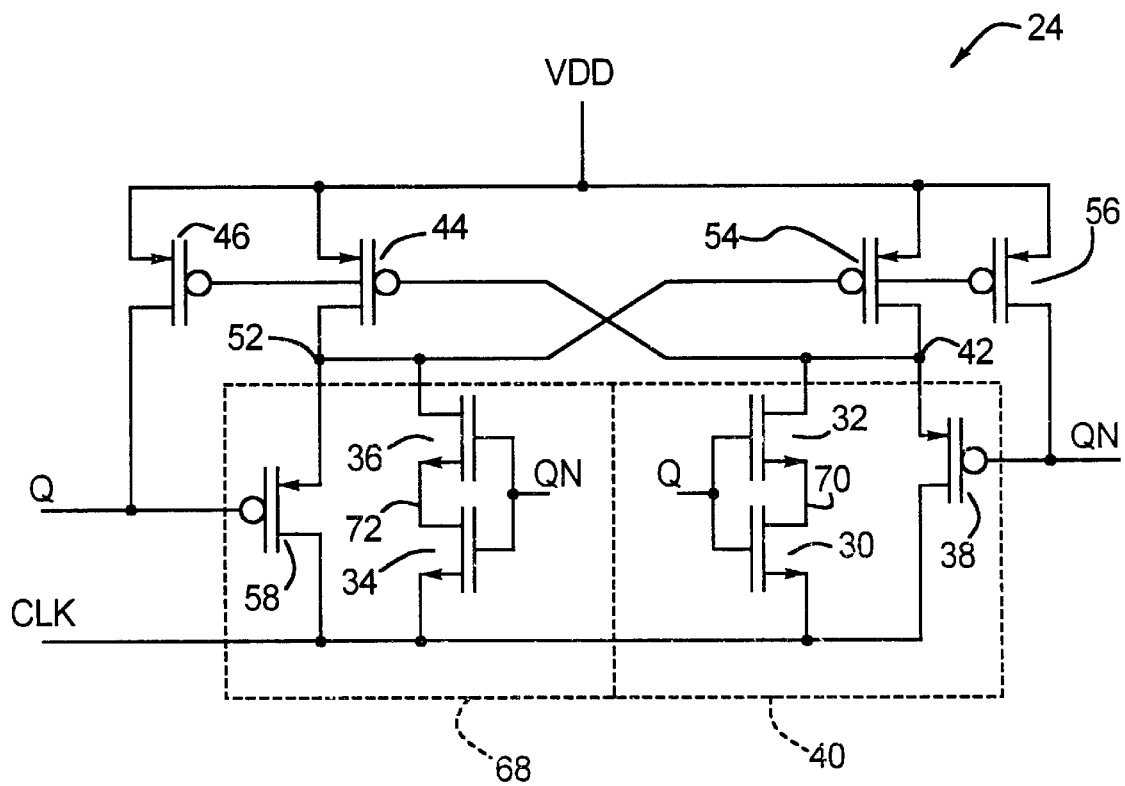
FIG. 5 shows one embodiment an SEU hardening circuit that can be used to SEU harden the positive-level-sensitive D latch of FIG. 4.
Figure 4:
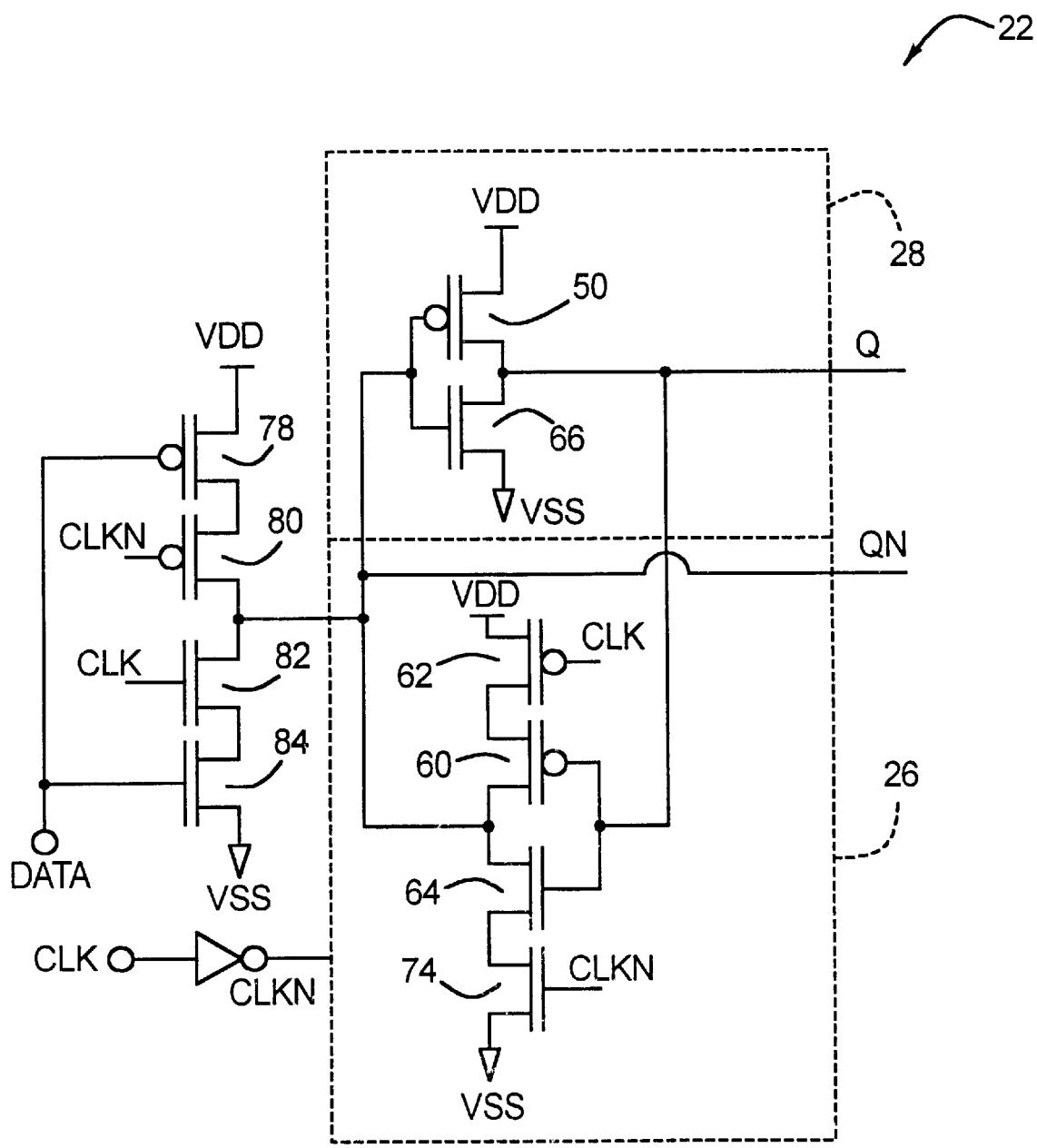
FIG. 4 shows a positive-level-sensitive D latch to be hardened by the present invention.

FIG. 4 illustrates a positive-level-sensitive D latch 22 (i.e., the latch 22 is transparent when CLK=H), and FIG. 5 illustrates an SEU hardening circuit 24 that can be used to SEU harden the positive-level-sensitive D latch 22. The latch 22 and the SEU hardening circuit 24 are coupled together through nodes Q and QN. Although the SEU hardening circuit 24 as shown in FIG. 4 is to be used with the latch 22, it should be understood that the SEU hardening circuit 24 can also be used with other types of storage elements such as a master or slave of a flip-flop, a memory cell, a register, etc.

During a stored data state when the latch 22 is closed (CLK=L), the nodes Q and QN are actively driven by gates 26 and 28 and by the SEU hardening circuit 24. In a stored data state, the regions that are vulnerable to a particle strike that can cause a SEU are the reverse biased pn junction regions around sources and drains or under gates that result in a current path between the nodes Q and QN and the source VDD or VSS. For example, if Q=H and QN=L, then there is a reverse biased pn junction around the drain and under the gate of a transistor 66 which, if struck by a particle, results in a current flow from the node Q to VSS that tries to discharge the node Q to VSS (i.e., to Q=L). If the discharging current is greater than the holding current provided by transistor 50, then an upset will occur.

The amount of discharge current created by the particle is proportional to the mass and energy of the particle and the gain of the parasitic BJT, and is inversely proportional to the impedance between the struck region and the node Q and between the struck region and VSS. The amount of holding current is proportional to the width/length (W/L) of the transistors providing the holding current. Thus, SEU hardness (i.e., immunity) is enhanced by reducing the discharge current and/or increasing the holding current. Even if the original data state stored in the latch 22 is upset, SEU hardness is enhanced if the pre-SEU data state is maintained in the SEU hardening circuit 24 and if, after the charge collection time from the particle ends, the maintained pre-SEU data state holding current from the on hardened p-channel transistor 46 or 54 in the SEU hardening circuit 24 can overdrive the holding current of the upset data state in the latch 22 and impose the pre-SEU data state back onto the latch 22.

The SEU hardening circuit 24 shown in FIG. 5 makes the nodes Q and QN more immune to SEUs from particles by increasing the holding current without adding regions sensitive to SEUs and/or by maintaining the pre-SEU data state and imposing this state back onto the latch 22. The SEU hardening circuit 24 works as described immediately below.

When the node Q is in a high state and the node QN is in a low state (CLK=L), n-channel transistors 30 and 32 and a p-channel transistor 38 of a gate 40 are on, driving a node 42 to a low state and, therefore, turning p-channel transistors 44 and 46 on. N-channel transistors 34 and 36 and a p-channel transistor 58 of a gate 68 are off. Therefore, the p-channel transistor 44 drives the node 52 to a high state thereby turning off p-channel the transistors 54 and 56. The p-channel hardening transistor 46 provides drive to the node Q from VDD which connects to the node Q of the latch 22 in FIG. 4 and, therefore, supplements the holding current provided by the p-channel transistor 50 of the gate 28 from VDD.

If the holding current is insufficient and the SEU event causes the node Q to go to a low state and causes the node QN to go to a high state, then the gate 40 turns off and the gate 68 turns on in the SEU hardening circuit 24. If the drive of the gate 68 in series with the CLK driver is sufficiently small compared to the drive of the transistor 44 such that the voltage of the node 52 does not fall enough to turn the transistor 54 on, then the p-channel transistors 44 and 46 remain on since there is no pull up drive on the node 42. Thus, the original states of the p-channel transistors 46 and 56 are maintained, and the pre-SEU data state is stored in the SEU hardening circuit 24. Once the particle charge collection time has ended, the drive of the on p-channel transistor 46 overdrives the now on transistor 66 in the latch 22 to return Q to a high state, such that the pre-SEU data state that was stored in the SEU hardening circuit 24 is returned to the latch 22.

It should be noted that, if the drive provided by the gate 68 in series with the CLK driver is not sufficiently small compared to the drive provided by the transistor 44, the voltage of the node 52 does fall enough to turn the transistor 54 on. As a result, the p-channel transistors 54 and 56 will turn on and the node 42 will go high thereby turning off the p-channel transistors 44 and 46 resulting in a state that reinforces the upset data state of the latch 22. However, it takes time for these state changes on the p-channel transistors 46 and 56 to complete. If, at the time the particle charge collection is finished, the p-channel transistors 44 and 46 on drive is greater than the p-channel transistors 54 and 56 on drive, and if the on drive of the p-channel transistors 44 and 46 is still sufficient to overdrive the now on transistor 66 in the latch 22 to return the node Q to a high state, then the pre-SEU data state that was stored in the SEU hardening circuit 24 is returned to the latch 22 and the transitioning in the hardening circuit 24 from the pre-SEU data to the upset data state is halted and then reversed.

When the node Q is in a low state and the node QN is in a high state (CLK=L), a p-channel transistor 58 and the n-channel transistors 34 and 36 of the gate 68 are on thereby driving the node 52 to a low state, which turns on the p-channel transistors 54 and 56. The n-channel transistors 30 and 32 and the p-channel transistor 38 of the gate 40 are off. Therefore, the transistor 54 drives the node 42 to a high state to thereby turn off the p-channel transistors 44 and 46. The p-channel hardening transistor 56 provides drive to the node QN from VDD and, therefore, supplements the holding current from VDD provided to the node QN by series coupled p-channel transistors 60 and 62 of the gate 26.

If the holding current is insufficient and the SEU event causes the node Q to go to a high state and causes the node QN to go to a low state, then the gate 68 turns off and the gate 40 turns on in the SEU hardening circuit 24. If the drive of the gate 40 in series with the CLK driver is sufficiently small compared to the drive of the transistor 54, the voltage of the node 42 does not fall enough to turn the transistor 44 on. As a result, the p-channel transistors 54 and 56 remain on since there is no pull up drive on the node 52. Thus, the original states of the p-channel transistors 46 and 56 are maintained. Once the particle charge collection time has ended, the pre-SEU data state that was stored in the SEU hardening circuit 24 is returned to the latch 22 if the drive of the on p-channel transistor 56 can overdrive the now on transistor 64 in the latch 22 to return the node QN to a high state.

It should be noted that, if the drive of the gate 40 in series with the CLK driver is not sufficiently small compared to the drive of the transistor 54, the voltage of the node 42 does fall enough to turn the transistor 44 on. As a result, the p-channel transistors 44 and 46 will turn on and the node 52 will go to a high state thereby turning off the p-channel transistors 54 and 56 resulting in a state that reinforces the upset data state of the latch 22. However, it takes time for these state changes on the p-channel transistors 46 and 56 to complete. If, at the time the particle charge collection is finished, the p-channel transistors 54 and 56 on drive is greater than the p-channel transistors 44 and 46 on drive, and if the on drive of the p-channel transistors 54 and 56 is still sufficient to overdrive the now on transistor 64 in the latch 22 to return the node QN to a high state, then the pre-SEU data state that was stored in the SEU hardening circuit 24 is returned to the latch 22 and the transitioning in the SEU hardening circuit 24 from the pre-SEU data to the upset data state is halted and then reversed.

When the latch 22 is transparent (i.e., CLK=H), the CLK=L to CLK=H state change passes through whichever of the gates 40 and 68 is on if the SEU hardening circuit 24 is on, and turns off whichever of the p-channel transistors 44 and 54 is on. The net result is that both of the p-channel hardening transistors 46 and 56 will be off. Therefore, the node Q will be set to the level on the data line DATA, and the node QN will be set to the logical not of the data on the data line DATA unhindered by the SEU hardening circuit 24.

To tolerate a large amount of deposited charge on the node Q or the node QN (i.e., to increase Qcrit on the node Q or the node QN) in a stored data state, the widths (i.e., drive) of the n-channel transistors 64 and 66 and the widths of the p-channel transistors 46 and 56 may be set large enough to provide a drive strength sufficient to overcome the current created by the deposited charge. Since the SER is inversely proportional to Qcrit, the SER is inversely proportional to the width. Thus, the width is set according to the desired SER level.

Also, the maximum drive of the clock used to drive the latch 22 must be taken into account in determining how large to make the widths of the n-channel transistors 64 and 66 and of the p-channels 46 and 56. The larger the clock drive, the wider the width of these transistors should be in order to overcome the deposited charge on the node Q or the QN. The reason for this relationship is that a large clock drive in series with the gate 40 or the gate 68 of the SEU hardening circuit 24 drives the node 42 or the node 52 to a low state faster than a small clock drive. Therefore, a deposited charge on the node Q or on the node QN can turn off the p-channel hardening transistor 46 or the p-channel hardening transistor 56 faster with a large clock drive than with a small clock drive.

For example, when the node QN is in a low state and CLK=L, a particle strike on the depletion region under the gate of the p-channel transistor 60 can charge the node QN to a high state that quickly forces the node Q to a low state. When the node QN is in a high state and the node Q is in a low state, the p-channel transistor 38 and the n-channel transistors 30 and 32 are off, and the p-channel transistor 58 and the n-channel transistors 34 and 36 are on. Accordingly, the node 52 discharges to a low state faster for a large clock drive than for a small clock drive.

When the node 52 is in a low state, the transistor 54 is on and drives the node 42 to a high state. When the node 42 is in a high state, the p-channel hardening transistor 46 is off such that the drive provided by the n-channel transistor 66 overcomes the drive provided by the p-channel transistor 50 to re-enforce the data state change on the node QN.

The widths of the n-channel transistors 64 and 66 and the widths of the p-channel transistors 46 and 56 can be increased to provide extra drive to the nodes Q and QN in order to overcome small deposited charges on the nodes Q and QN (i.e., increase Qcrit). Increasing the widths of the n-channel transistors 64 and 66 and the p-channel transistors 46 and 56 does not significantly affect circuit performance (e.g., clock power, Clock-Q timing, etc.) because these transistors are not in the direct path of the clock (or the gates of these transistors are not controlled by the clock). Since the SER is inversely proportional to Qcrit, the SER is inversely proportional to width. Thus, the width is set according to the desired SER level.

In addition, the strength of the drive provided by the gate 40 to the p-channel transistor 54, and the strength of the drive provided by the gate 68 to the p-channel transistor 44 are important because they control how fast the p-channel hardening transistors 46 and 56 can switch. These drive strengths must be small enough that they can switch the p-channel hardening transistors 46 and 56 within the operating frequency, but not so large as to quickly turn off the p-channel hardening transistors 46 and 56 as a result of a small SEU particle striking the node Q or the node QN.

Furthermore, the layout separation between the n-channel transistors 30 and 32 and between the n-channel transistors 34 and 36 should be large enough such that the probability of a particle simultaneously striking the depletion regions under both gates of the n-channel transistors 30 and 32 and/or under both gates of the n-channel transistors 34 and 36 is less than the desired SER.

The substrate and source regions of each of the n-channel transistors 30, 32, 34, and 36 can be coupled together (the source region is the side closest to the CLK node), or the substrates of the n-channel transistors 30, 32, 34, and 36 can be coupled to VSS (the traditional coupling of the substrates of n-channel transistors), or the substrates of the n-channel transistors 30, 32, 34, and 36 can be left floating.

The SEU hardening and operation of the circuit 24 is similar between the substrate to source region connection case and the floating substrate case. Accordingly, only the substrate to source region connection case is discussed in detail herein. When the n-channel transistors 30 and 32 are off, the node QN is in a high state, the node Q is in a low state, the node 52 is in a low state, the node 42 is in a high state, and a node 70 is in a capacitance high state (VDD–Vthnmos, where Vthnmos is the threshold voltage of an n-channel transistor). A particle striking the depletion region under the gate of the n-channel transistor 30 can discharge the node 70 to a low state because CLK=L and, therefore, connects the node CLK to VSS. But, because the n-channel transistor 32 remains off, there is no current path from the node 42 to VSS. Thus, there is no change in the state at the node 42 and, consequently, no change in the stored data state.

Similarly, a particle striking the depletion region under the gate of the n-channel transistor 32 under the same conditions (except that the node 70 is now in a capacitance low state) charges the node 70 to a capacitance high state (VDD–Vthnmos). But, because the n-channel transistor 30 remains off, there is no current path from the node 42 to VSS. Thus, there is no change in the state at the node 42 and consequently no change in the stored data state. The p-channel transistors 38 and 54 do not have any reverse biased pn junctions connected to the node 42. Therefore, particle strikes on these transistors will not cause a state change on the node 42. The n-channel transistors 34 and 36 do not have any reverse biased pn junctions connected to the node 52. Therefore, particle strikes on these transistors will not cause a state change on the node 42. The p-channel transistors 44 and 58 do have reverse biased pn junctions connected to the node 52. Therefore, particle strikes on these transistors will cause a low to high state change on the node 52. However, this only turns the transistors 54 and 56 off, and no transistors turn on. Since this does not disturb the stored data state in the latch 22, after the charge collection time is ended, the node 52 returns to its original state. Due to circuit symmetry, when the node Q is high and the node QN is low, the complement of the above description occurs.

An advantage of the substrate to source region coupling case over the substrate floating case is that the n-channel transistors 30, 32, 34, and 36 switch faster in the substrate to source region connection case than in the substrate floating case. The reason for this faster switching is that there is no difference in the source-to-substrate voltages (e.g., Vsb for the n-channel transistor 30=Vsb for the n-channel transistor 32=Vsb for the n-channel transistor 34=Vsb for the n-channel transistor 36=0). Thus, the depletion-layer width remains constant for the substrate to source region connection case, thereby minimizing body-effect on the threshold voltage.

The faster the n-channel transistors 30, 32, 34, and 36 can switch for a small width without increasing the SER, the faster the p-channel hardening transistors 46 and 56 switch within the operating frequency. Therefore, connecting each of the substrates of the n-channel transistors 30, 32, 34, and 36 to its corresponding source region is a preferred option for SEU hardening and circuit speed.

However, leaving the substrates of the n-channel transistors 30, 32, 34, and 36 floating does provide the same level of SEU hardening to the data storage element. It should be noted that the floating substrate case is easy to implement in SOI technology but is much more difficult to accomplish in bulk silicon technology because generally either of the p- and n-channel transistors share a common n/p-type chip substrate.

As mentioned above, the substrates of the n-channel transistors 30, 32, 34, and 36 could be connected to VSS. However, this connection results in a sensitive volume (i.e., reverse biased pn junction) being present on the node 42 when it is high or on the node 52 when it is high. The SEU analysis is similar for the sensitive volume on the nodes 42 and 52, so the SEU analysis will be discussed in detail only for the sensitive volume on the node 42.

When the n-channel transistors 30 and 32 are off, the node QN is in a high state, the node Q is in a low state, the node 70 is in a capacitance high state (VDD−Vthnmos), the node 42 is in a high state, and the pn junction formed between the node 42 and the substrate of the n-channel transistor 32 (the substrate of the n-channel transistor 32 is at VSS) is reverse biased. The resulting depletion region creates a sensitive volume on the node 42 because a particle strike through the depletion region causes the node 42 to discharge to a low state.

When the node 42 is in a low state, the p-channel transistors 44 and 46 turn on, charging the node 52 and the node Q to a high state. When the node 52 is in a high state, the p-channel transistors 54 and 56 (the p-channel transistor 56 is the hardening transistor for the node QN) turn off. The high state on the node Q turns on the n-channel transistor 64, overcoming the p-channel transistors 60 and 62 and driving the node QN to a low state. So, a particle striking the node 42 can turn off the p-channel hardening transistor 56, causing a data state change on the node Q that quickly causes a data state change on the node QN which reinforces the data state change on the node Q.

Therefore, connecting the substrate of the n-channel transistors 30, 32, 34, and 36 to VSS is not an ideal option for SEU hardening. But this option does provide some SEU hardening against particle strikes on the sensitive volume on the nodes Q and QN associated with the gates 26 and 28. Thus, the SEU hardening circuit 24 with the substrates of the n-channel transistors 30, 32, 34, and 36 connected to VSS can reduce the net SER because the number of sensitive volumes is reduced and the total SER is the sum of the SERs on all sensitive volumes in the data storage loop.

Figure 6:
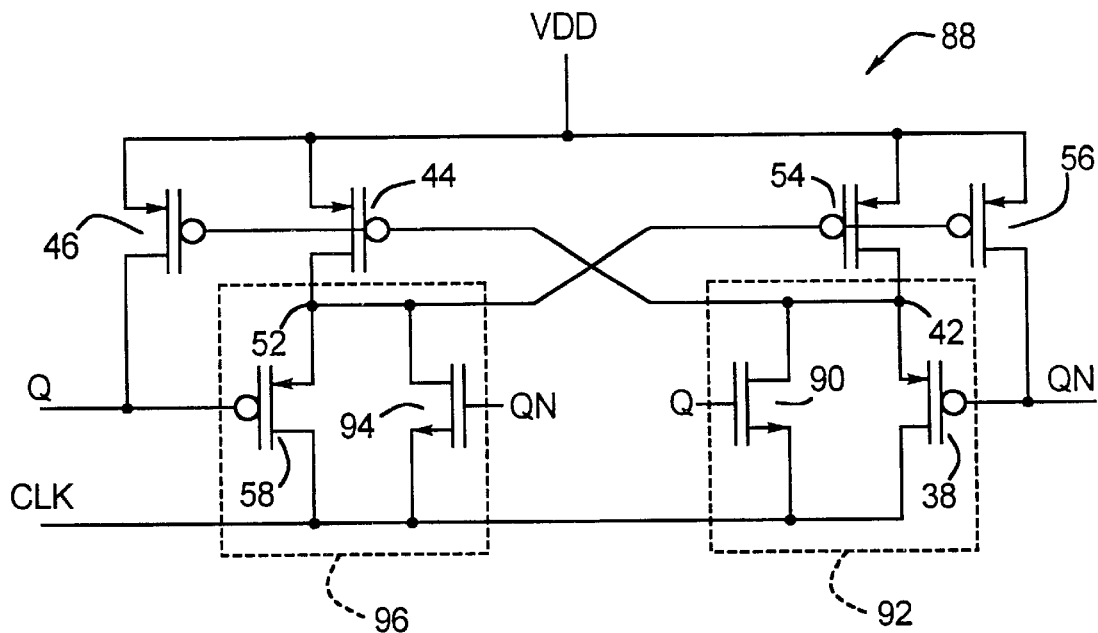
FIG. 6 shows an alternative SEU hardening circuit that can be used to SEU harden the positive-level-sensitive D latch of FIG. 4.

FIG. 6 shows an alternative SEU hardening circuit 88 that can be used with the latch 22. As can be seen, the n-channel transistors 30 and 32 of the gate 40 shown in FIG. 5 are replaced with one n-channel transistor 90 of a gate 92 shown in FIG. 6, and the n-channel transistors 34 and 36 of the gate 68 shown in FIG. 5 are replaced with one n-channel transistor 94 of a gate 96 shown in FIG. 6. Otherwise, the SEU hardening circuit 88 is the same as the SEU hardening circuit 24 and, therefore, the same reference numerals are used to designate the common elements in FIGS. 5 and 6.

The SEU hardening and operation of the SEU hardening circuit 88 will not be discussed in detail since the SEU hardening circuit 88 is similar to the SEU hardening circuit 24 shown in FIG. 5, which has been discussed in detail above. The major difference of the SEU hardening provided by the SEU hardening circuit 88 over the SEU hardening provided by the SEU hardening circuit 24 is that, when the substrates of the n-channel transistors 90 and 94 are connected according to the three options discussed above (substrate to source, substrate to VSS, and substrate floating), a sensitive volume is present on the node 42 when it is high or on the node 52 when it is high. But all three options do provide SEU hardening against particle strikes on the sensitive volumes in the latch 22. Thus, it is very similar in SEU hardness to the n-channel transistor substrate connection to VSS option of the SEU hardening circuit 24.

Figure 7:
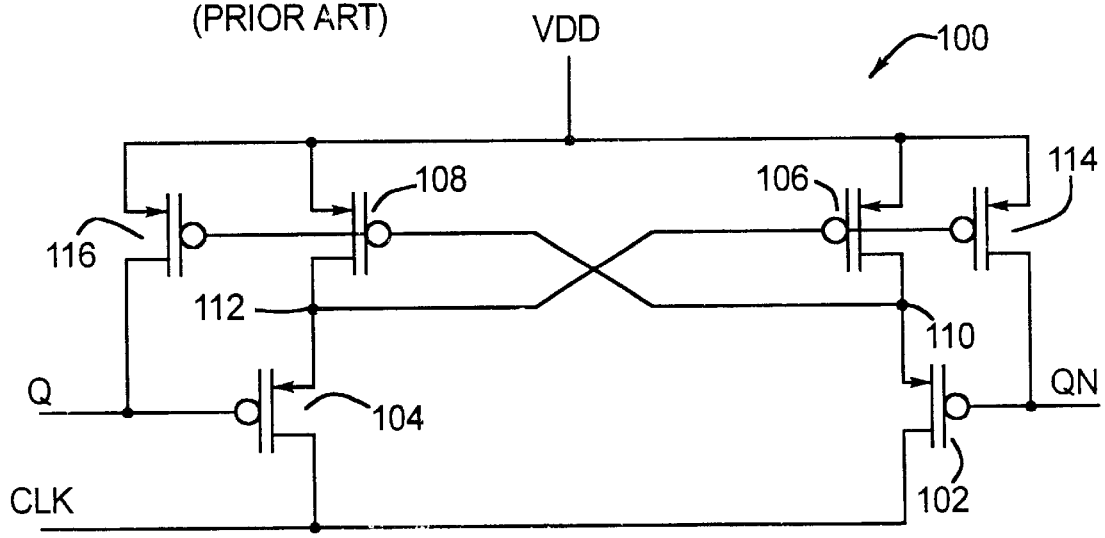
FIG. 7 shows a prior art SEU hardening circuit which is useful in providing a contrast to the SEU hardening circuits of FIGS. 5 and 6.

FIG. 7 shows a known SEU hardening circuit 100 for a positive-level-sensitive D latch. The major difference between the known SEU hardening circuit 100 and the SEU hardening circuits 24 and 88 described above is that, in the case of the known SEU hardening circuit 100, the p-channel transistors 102 and 104 do not provide a full rail drive to a low state from the node CLK to the nodes 110 and 112, but instead provide drive only as low as VSS+Vthpmos (where Vthpmos is the threshold voltage of a p-channel transistor) to the nodes 110 and 112. The drive of the SEU hardening p-channel transistors 114 and 116 is dependent on the node 110 and 112 voltages. The higher these voltages, the less the drive. Ideally, the lowest voltage on the node 110 or 112 is VSS+Vthpmos. In reality, the pulldown drive from the p-channel transistors 102 and 104 near VSS+Vthpmos is very weak. Therefore, small leakage currents or noise can result in a node voltage that is greater than VSS+Vthpmos and that is highly variable. A variably reduced drive on the transistors 114 and 116 creates a reduced and non-uniform SEU hardness. This can be compensated for by increasing the width of the transistors 114 and 116, but this solution reduces normal operating speed. These problems are fixed by adding the n-channel transistors 30, 32, 34, and 36 of the SEU hardening circuit 24 and the n-channel transistors 90 and 94 of the SEU hardening circuit 88.

The latch 22 includes p-channel transistors 78 and 80 and n-channel transistors 74, 82, and 84.

Figure 8:
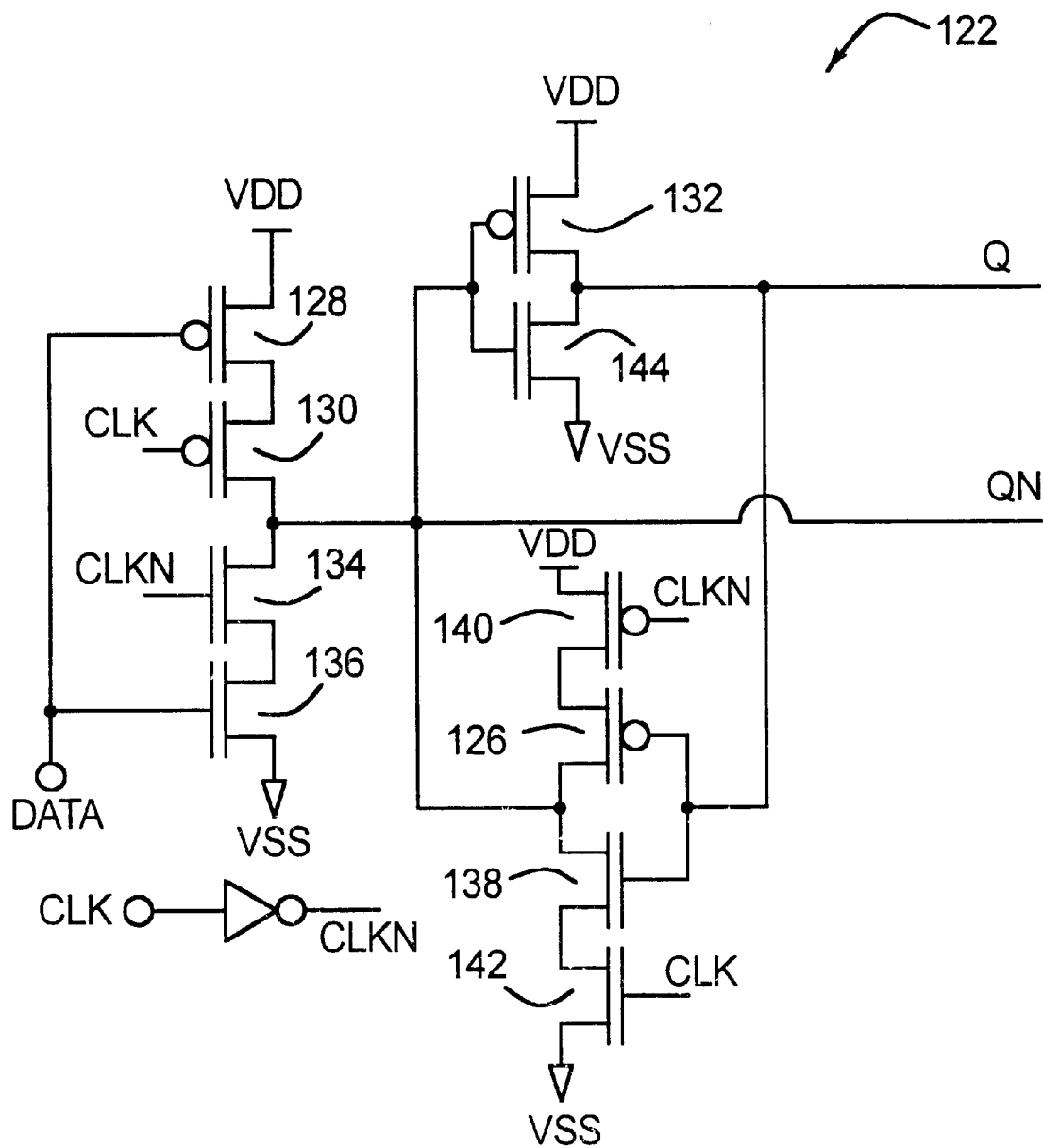
FIG. 8 shows a negative-level-sensitive D latch to be hardened by the present invention.
Figure 9:
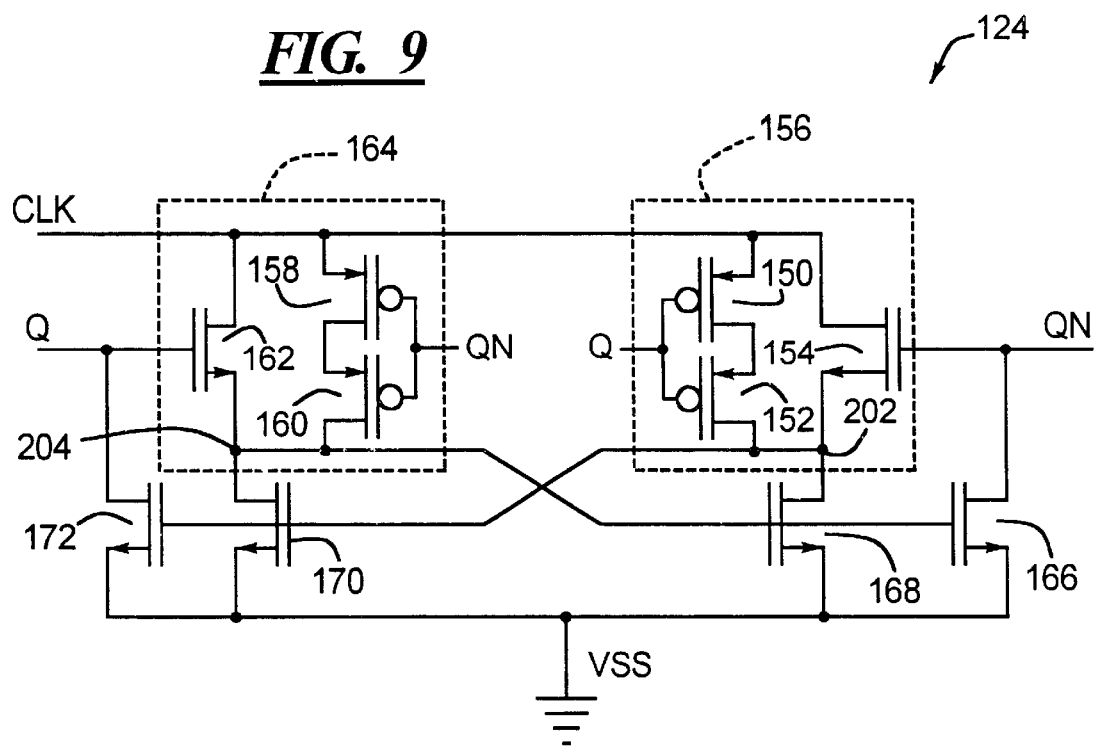
FIG. 9 shows one embodiment an SEU hardening circuit that can be used to SEU harden the negative-level-sensitive D latch of FIG. 8.

FIG. 8 illustrates a negative-level-sensitive D latch 122 (i.e., the latch is transparent when CLK=L), and FIG. 9 illustrates an SEU hardening circuit 124 that can be used to SEU harden the negative-level-sensitive D latch 122. The latch 122 and the SEU hardening circuit 124 are coupled together through the nodes Q and QN. As before, the latch 122 can be other types of storage elements such as a master or slave of a flip-flop, a memory cell, a register, etc.

The latch 122 includes p-channel transistors 126, 128, 130, 132, and 140 and n-channel transistors 134, 136, 138, 142, and 144. The SEU hardening circuit 124 includes p-channel transistors 150 and 152 and an n-channel transistor 154 forming a gate 156, p-channel transistors 158 and 160 and an n-channel transistor 162 forming a gate 164, and n-channel transistors 166, 168, 170, and 172.

The SEU hardening and operation of the SEU hardening circuit 124 shown in FIG. 9 is not discussed in detail herein because the SEU hardening circuit 124 is similar to the SEU hardening circuit 24 used with the positive-level-sensitive D latch 22, which has been discussed in detail above.

Figure 10:
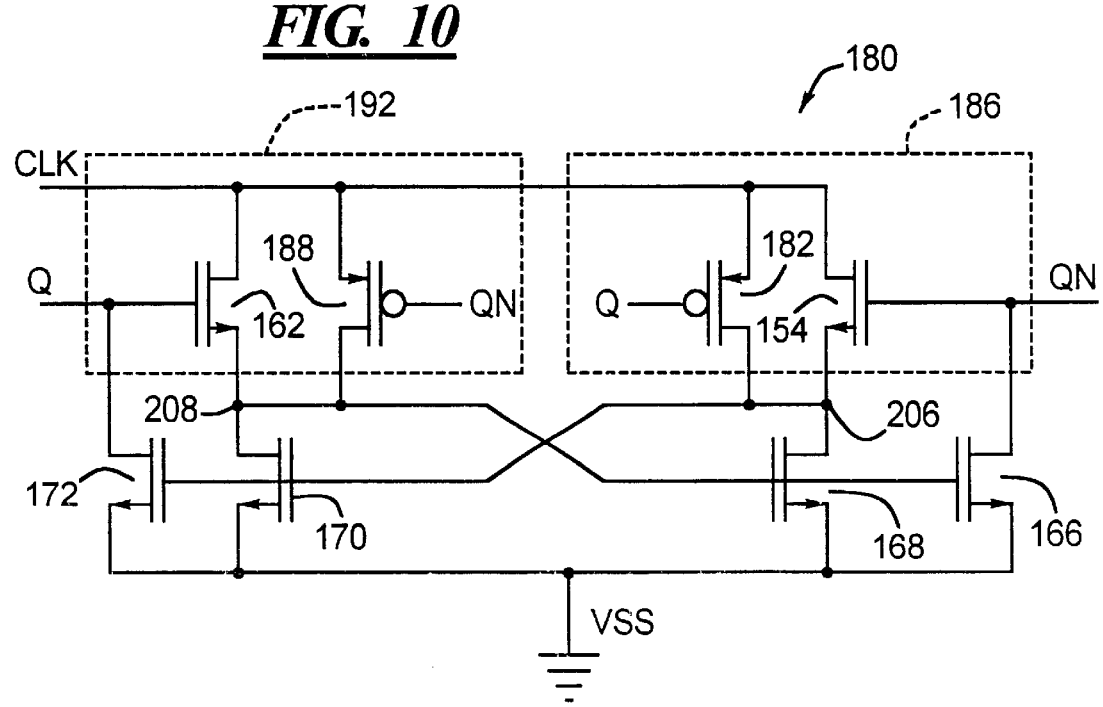
FIG. 10 shows an alternative SEU hardening circuit that can be used to SEU harden the negative-level-sensitive D latch of FIG. 8; and, FIG. 11 shows a prior art SEU hardening circuit which is useful in providing a contrast to the SEU hardening circuits of FIGS. 9 and 10.

FIG. 10 shows an alternative SEU hardening circuit 180 that can be used with the latch 122. The SEU hardening circuit 180 includes a p-channel transistor 182 and the n-channel transistor 154 forming a gate 186, a p-channel transistor 188 and the n-channel transistor 162 forming a gate 192, and the n-channel transistors 166, 168, 170, and 172.

The SEU hardening and operation of the SEU hardening circuit 180 shown in FIG. 10 is not discussed in detail herein because the SEU hardening circuit 180 is similar to the SEU hardening circuit 88 used with the positive-level-sensitive D latch 22, which has been discussed adequately above.

It should be noted that the gate 156 of FIG. 9 provides full rail drive from the node CLK to a node 202 when on, and the gate 164 of FIG. 9 provides full rail drive from the node CLK to a node 204 when on. Similarly, the gate 186 of FIG. 10 provides full rail drive from the node CLK to a node 206 when on, and the gate 192 of FIG. 10 provides full rail drive from the node CLK to a node 208 when on.

Figure 11:
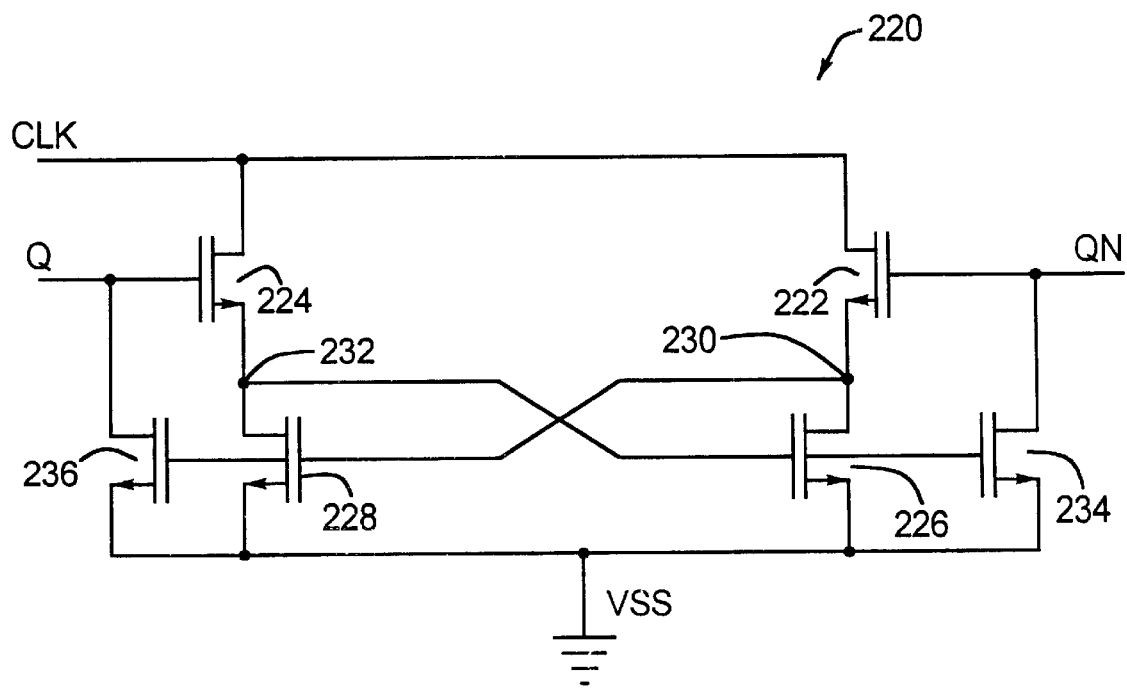

FIG. 11 shows a known SEU hardening circuit 220 for a negative-level-sensitive D latch. The major difference between the known SEU hardening circuit 220 and the SEU hardening circuits 124 and 180 described above is that, in the case of the known SEU hardening circuit 220, the n-channel transistors 222 and 224 in FIG. 11 do not provide a full rail drive to a full high state of VDD, but instead to a high state of VDD–Vthnmos (where Vthnmos is the threshold voltage of an n-channel transistor). By contrast, the p-channel transistors 150, 152, 158, and 160 of the SEU hardening circuit 124 and the p-channel transistors 182 and 188 of the SEU hardening circuit 180 do provide a full rail drive to a full high state of VDD. Operating deficiencies are not discussed in detail herein because they are similar to those of the SEU hardening circuit 100 which have been adequately discussed above.

Certain modifications of the present invention will occur to those practicing in the art of the present invention. For example, although the hardening circuits 24 and 88 of FIGS. 5 and 6 have been described above for use with the latch 22 of FIG. 4, it should be noted that the hardening circuits 24 and 88 of FIGS. 5 and 6 could instead be used with the latch 122 of FIG. 8 by inverting the clock input to the hardening circuits 24 and 88. Similarly, the hardening circuits 124 and 180 of FIGS. 9 and 10 can instead be used with the latch 22 of FIG. 4 by inverting the clock input to the hardening circuits 124 and 180.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A hardening system comprising:
    a data storage device having a data input, a clock input, and a data state reinforcing feedback path having a data node Q and a data complement node QN, wherein the data storage device is arranged to provide drive to the data node Q and the data complement node QN; and,
    a hardening circuit coupled to the data state reinforcing feedback path, wherein the hardening circuit is arranged to provide extra drive to the data node Q and the data complement node QN so as to prevent the data node Q and the data complement node QN from changing states in the presence of radiation, and wherein the hardening circuit is arranged to provide full rail drive to internal nodes of the hardening circuit.

2. The hardening system of claim 1 wherein the hardening circuit comprises:
    a hardening transistor coupled to drive at least one of the data node Q and the data complement node QN;
    a first transistor path coupled to a gate of the hardening transistor, wherein the first transistor path includes first and second series coupled transistors; and,
    a second transistor path coupled to the gate of the hardening transistor and in parallel to the first transistor path, wherein the second transistor path comprises a single transistor.

3. The hardening circuit of claim 2 wherein the hardening transistor comprises a p-channel transistor, wherein the first and second series coupled transistors each comprises an n-channel transistor, and wherein the single transistor comprises a p-channel transistor.

4. The hardening circuit of claim 2 wherein the hardening transistor comprises an n-channel transistor, wherein the first and second series coupled transistors each comprises a p-channel transistor, and wherein the single transistor comprises an n-channel transistor.

5. The hardening circuit of claim 2 wherein each of the first and second series coupled transistors has a substrate region and a source region, wherein the substrate and source regions of the first series coupled transistor are coupled together, wherein the substrate and source regions of the second series coupled transistor are coupled together, and wherein the source is the clock input side of the transistor and the source region of at least one of the series coupled transistors is coupled to a clock input.

6. The hardening system of claim 2 wherein VDD and VSS comprise reference potentials, wherein each of the first and second series coupled transistors has a substrate, wherein the substrate of the first series coupled transistor is coupled to VSS if the first series coupled transistor is an n-channel transistor and to VDD if the first series coupled transistor is a p-channel transistor, and wherein the substrate of the second series coupled transistor is coupled to VSS if the second series coupled transistor is an n-channel transistor and to VDD if the second series coupled transistor is a p-channel transistor.

7. The hardening system of claim 2 wherein each of the first and second series coupled transistors has a substrate, wherein the substrate of the first series coupled transistor is floating, and wherein the substrate of the second series coupled transistor is floating.

8. The hardening system of claim 2 wherein the first and second series coupled transistors have corresponding source/drain circuits coupled in series between a gate of the hardening transistor and the clock input and corresponding gates coupled to the data node Q, and wherein the single transistor has a source/drain circuit coupled between the gate of the hardening transistor and the clock input and a gate coupled to a not of the data complement node QN.

9. The hardening circuit of claim 8 wherein the hardening transistor comprises a p-channel transistor, wherein the first and second series coupled transistors each comprises an n-channel transistor, and wherein the single transistor comprises a p-channel transistor.

10. The hardening circuit of claim 8 wherein the hardening transistor comprises an n-channel transistor, wherein the first and second series coupled transistors each comprises a p-channel transistor, and wherein the single transistor comprises an n-channel transistor.

11. The hardening system of claim 1 wherein the hardening circuit comprises:

a hardening transistor coupled to drive at least one of the data node Q and the data complement node QN;

a first transistor path coupled to a gate of the hardening transistor, wherein the first transistor path includes a first single transistor; and, a second transistor path coupled to the gate of the hardening transistor, wherein the second transistor path includes a second single transistor.

12. The hardening circuit of claim 11 wherein the hardening transistor comprises a p-channel transistor, wherein the first single transistor comprises an n-channel transistor, and wherein the second single transistor comprises a p-channel transistor.

13. The hardening circuit of claim 11 wherein the hardening transistor comprises an n-channel transistor, wherein the first single transistor comprises a p-channel transistor, and wherein the second single transistor comprises an n-channel transistor.

14. The hardening circuit of claim 11 wherein the first single transistor has a substrate region and a source region, wherein the substrate and source regions of the first single transistor are coupled together, and wherein the source is the clock input side of the transistor and the source region of the first single transistor is coupled to a clock input.

15. The hardening system of claim 11 wherein VDD and VSS comprises reference potentials, wherein the first single transistor has a substrate, and wherein the substrate is coupled to VSS if the first single transistor is an n-channel transistor and to VDD if the first single transistor is a p-channel transistor.

16. The hardening system of claim 11 wherein the first single transistor has a substrate, and wherein the substrate is floating.

17. The hardening system of claim 11 wherein the first single transistor comprises a source/drain circuit coupled between a gate of the hardening transistor and the clock input, and a gate coupled to the data node Q, and wherein the second single transistor comprises a source/drain circuit coupled between the gate of the hardening transistor and the clock input, and a gate coupled to the data complement node QN.

18. The hardening circuit of claim 17 wherein the hardening transistor comprises a p-channel transistor, wherein the first single transistor comprises an n-channel transistor, and wherein the second single transistor comprises a p-channel transistor.

19. The hardening circuit of claim 17 wherein the hardening transistor comprises an n-channel transistor, wherein the first single transistor comprises a p-channel transistor, and wherein the second single transistor comprises an n-channel transistor.

20. A hardening circuit for an integrated circuit having a data state reinforcing feedback path with a data node Q and a data complement node QN comprising:

a first hardening transistor coupled between a rail and the data node Q, wherein the first hardening transistor is arranged to provide additional drive to the data node Q;

a second hardening transistor coupled between the rail and the data complement node QN, wherein the second hardening transistor is arranged to provide additional drive to the data complement node QN;

a first gate control circuit coupled between a clock input and a gate of the first hardening transistor, wherein the first gate control circuit includes first and second transistor paths each having a control input, wherein the control input of the first transistor path is coupled to the data node Q, and wherein the control input of the second transistor path is coupled to the data complement node QN;

a second gate control circuit coupled between the clock input and a gate of the second hardening transistor, wherein the second gate control circuit includes third and fourth transistor paths each having a control input, wherein the control input of the third transistor path is coupled to the data complement node QN, and wherein the control input of the fourth transistor path is coupled to the data node Q;

wherein the first and second gate control circuits are arranged to provide full rail drive to internal nodes of the hardening circuit.

21. The hardening circuit of claim 20 wherein the first transistor path comprises first and second series coupled transistors each having a control input coupled to the data node Q, wherein the second transistor path comprises a single third transistor having a control input coupled to the data complement node QN, wherein the third transistor path comprises fourth and fifth series coupled transistors each having a control input coupled to the data complement node QN, and wherein the fourth transistor path comprises a single sixth transistor having a control input coupled to the data node Q.

22. The hardening circuit of claim 21 wherein each of the first, second, fourth, and fifth transistors has a substrate region and a source region, wherein the substrate and source regions of the first transistor are coupled together, wherein the substrate and source regions of the second transistor are coupled together, wherein the substrate and source regions of the fourth transistor are coupled together, wherein the substrate and source regions of the fifth transistor are coupled together, and wherein the source is the clock input side of the transistor and the source regions of the second and fifth transistors are coupled to a clock input.

23. The hardening circuit of claim 21 wherein VDD and VSS comprises reference potentials, wherein each of the first, second, fourth, and fifth transistors has a substrate, wherein the substrate of the first transistor is coupled to VSS if the first transistor is an n-channel and to VDD if the first transistor is a p-channel transistor, wherein the substrate of the second transistor is coupled to VSS if the second transistor is an n-channel transistor and to VDD if the second transistor is a p-channel transistor, wherein the substrate of the fourth transistor is coupled to VSS if the fourth transistor is an n-channel transistor and to VDD if the fourth transistor is a p-channel transistor, and wherein the substrate of the fifth transistor is coupled to VSS if the fifth transistor is an n-channel transistor and to VDD if the fifth transistor is a p-channel transistor.

24. The hardening circuit of claim 21 wherein each of the first, second, fourth, and fifth transistors has a substrate, wherein the substrate of the first transistor is floating, wherein the substrate of the second transistor is floating, wherein the substrate of the fourth transistor is floating, and wherein the substrate of the fifth transistor is floating.

25. The hardening circuit of claim 21 wherein each of the first, second, fourth, and fifth transistors comprises an n-channel transistor, wherein each of the third and sixth transistors comprises a p-channel transistor, and wherein each of the first and second hardening transistors comprises a p-channel transistor.

26. The hardening circuit of claim 21 wherein each of the first, second, fourth, and fifth transistors comprises a p-channel transistor, wherein each of the third and sixth transistors comprises an n-channel transistor, and wherein each of the first and second hardening transistors comprises an n-channel transistor.

27. The hardening circuit of claim 20 wherein the first transistor path comprises a first single transistor having a control input coupled to the data node Q, wherein the second transistor path comprises a second single transistor having a control input coupled to the data complement node QN, wherein the third transistor path comprises a third single transistor having a control input coupled to the data complement node QN, and wherein the fourth transistor path comprises a fourth single transistor having a control input coupled to the data node Q.

28. The hardening circuit of claim 27 wherein each of the first and third transistors has a substrate region and a source region, wherein the substrate and source regions of the first transistor are coupled together, wherein the substrate and source regions of the third transistor are coupled together, and wherein the source is the clock input side of the transistor and the source regions of the first and third transistors are coupled to a clock input.

29. The hardening circuit of claim 27 wherein VDD and VSS comprises reference potentials, wherein each of the first and third transistors has a substrate, wherein the substrate of the first transistor is coupled to VSS if the first transistor is an n-channel transistor and to VDD if the first transistor is a p-channel transistor, and wherein the substrate of the third transistor is coupled to VSS if the third transistor is an n-channel transistor and to VDD if the third transistor is a p-channel transistor.

30. The hardening circuit of claim 27 wherein each of the first and third transistors has a substrate, wherein the substrate of the first transistor is floating, and wherein the substrate of the third transistor is floating.

31. The hardening circuit of claim 27 wherein each of the first and third transistors comprises an n-channel transistor, wherein each of the second and fourth transistors comprises a p-channel transistor, and wherein each of the first and second hardening transistors comprises a p-channel transistor.

32. The hardening circuit of claim 27 wherein each of the first and third transistors comprises a p-channel transistor, wherein each of the second and fourth transistors comprises an n-channel transistor, and wherein each of the first and second hardening transistors comprises an n-channel transistor.

33. A hardening system comprising:
a positive-level-sensitive D latch having a data input, a clock input, and a data state reinforcing feedback path having a data node Q and a data complement node QN, wherein the positive-level-sensitive D latch is coupled between rails VDD and VSS;
a first p-channel hardening transistor coupled between the rail VDD and the data node Q, wherein the first p-channel hardening transistor is arranged to provide drive to the data node Q in addition to drive provided by the positive-level-sensitive D latch;
a second p-channel hardening transistor coupled between the rail VDD and the data complement node QN, wherein the second p-channel hardening transistor is arranged to provide drive to the data complement node QN in addition to drive provided by the positive-level-sensitive D latch;
a first gate control circuit coupled between the clock input and a gate of the first p-channel hardening transistor, wherein the first gate control circuit includes a first n-channel transistor path and a first p-channel transistor path each having a control input, wherein the control input of the first n-channel transistor path is coupled to the data node Q, and wherein the control input of the first p-channel transistor path is coupled to the data complement node QN;
a second gate control circuit coupled between the clock input and a gate of the second p-channel hardening transistor, wherein the second gate control circuit includes a second n-channel transistor path and a second p-channel transistor path each having a control input, wherein the control input of the second p-channel transistor path is coupled to the data node Q, and wherein the control input of the second n-channel transistor path is coupled to the data complement node QN;
wherein the first and second gate control circuits are arranged to provide full rail drive to the internal nodes of the hardening system.

34. The hardening circuit of claim 33 wherein the first n-channel transistor path comprises at least two series coupled n-channel transistors each having a control input coupled to the data node Q, wherein the first p-channel transistor path comprises a p-channel transistor having a control input coupled to the data complement node QN, wherein the second n-channel transistor path comprises at least two series coupled n-channel transistors each having a control input coupled to the data complement node QN, and wherein the second p-channel transistor path comprises a p-channel transistor having a control input coupled to the data node Q.

35. The hardening circuit of claim 34 wherein each of the transistors of the first and second n-channel transistor paths has a substrate region and a source region, wherein the substrate and source regions of each corresponding transistor of the first and second n-channel transistor paths are coupled together, and wherein the source is the clock input side of the transistor and the source regions of at least one of the transistors in each of the first and second n-channel transistor paths is coupled to a clock input.

36. The hardening circuit of claim 34 wherein each of the transistors of the first and second n-channel transistor paths has a substrate, and wherein the substrate of each of the transistors of the first and second n-channel transistor paths is coupled to the rail VSS.

37. The hardening circuit of claim 34 wherein each of the transistors of the first and second n-channel transistor paths has a substrate, and wherein the substrate of each of the transistors of the first and second n-channel transistor paths is floating.

38. The hardening circuit of claim 33 wherein the first n-channel transistor path comprises an n-channel transistor having a control input coupled to the data node Q, wherein the first p-channel transistor path comprises a p-channel transistor having a control input coupled to the data complement node QN, wherein the second n-channel transistor path comprises an n-channel transistor having a control input coupled to the data complement node QN, and wherein the second p-channel transistor path comprises a p-channel transistor having a control input coupled to the data node Q.

39. The hardening circuit of claim 38 wherein each of the transistors of the first and second n-channel transistor paths has a substrate region and a source region, and wherein the substrate and source regions of each corresponding transistor of the first and second n-channel transistor paths are coupled together, and wherein the source is the clock input side of the transistor and the source regions of the transistors in the first and second n-channel transistor paths are coupled to a clock input.

40. The hardening circuit of claim 38 wherein each of the transistors of the first and second n-channel transistor paths has a substrate, and wherein the substrate of each of the transistors of the first and second n-channel transistor paths is coupled to the rail VSS.

41. The hardening circuit of claim 38 wherein each of the transistors of the first and second n-channel transistor paths has a substrate, and wherein the substrate of each of the transistors of the first and second n-channel transistor paths is floating.

42. A hardening system comprising:
a negative-level-sensitive D latch having a data input, a clock input, and a data state reinforcing feedback path having a data node Q and a data complement node QN, wherein the negative-level-sensitive D latch is coupled between rails VDD and VSS;
a first n-channel hardening transistor coupled between the rail VDD and the data node Q, wherein the first n-channel hardening transistor is arranged to provide drive to the data node Q in addition to drive provided by the negative-level-sensitive D latch;
a second n-channel hardening transistor coupled between the rail VDD and the data complement node QN, wherein the second n-channel hardening transistor is arranged to provide drive to the data complement node QN in addition to drive provided by the negative-level-sensitive D latch;
a first gate control circuit coupled between the clock input and a gate of the first n-channel hardening transistor, wherein the first gate control circuit includes a first n-channel transistor path and a first p-channel transistor path each having a control input, wherein the control input of the first n-channel transistor path is coupled to the data complement node QN, and wherein the control input of the first p-channel transistor path is coupled to the data node Q;
a second gate control circuit coupled between the clock input and a gate of the second n-channel hardening transistor, wherein the second gate control circuit includes a second n-channel transistor path and a second p-channel transistor path each having a control input, wherein the control input of the second p-channel transistor path is coupled to the data complement node QN, and wherein the control input of the second n-channel transistor path is coupled to the data node Q;
wherein the first and second gate control circuits are arranged to provide full rail drive to the internal nodes of the hardening system.

43. The hardening circuit of claim 42 wherein the first p-channel transistor path comprises at least two series coupled p-channel transistors each having a control input coupled to the data node Q, wherein the first n-channel transistor path comprises a n-channel transistor having a control input coupled to the data complement node QN, wherein the second p-channel transistor path comprises at least two series coupled p-channel transistors each having a control input coupled to the data complement node QN, and wherein the second n-channel transistor path comprises a n-channel transistor having a control input coupled to the data node Q.

44. The hardening circuit of claim 43 wherein each of the transistors of the first and second p-channel transistor paths has a substrate region and a source region, and wherein the substrate and source regions of each corresponding transistor of the first and second p-channel transistor paths are coupled together, and wherein the source is the clock input side of the transistor and the source regions of at least one of the transistors in each of the first and second p-channel transistor pates are coupled to a clock input.

45. The hardening circuit of claim 43 wherein each of the transistors of the first and second p-channel transistor paths has a substrate, and wherein the substrate of each of the transistors of the first and second p-channel transistor paths is coupled to the rail VDD.

46. The hardening circuit of claim 43 wherein each of the transistors of the first and second p-channel transistor paths has a substrate, and wherein the substrate of each of the transistors of the first and second p-channel transistor paths is floating.

47. The hardening circuit of claim 42 wherein the first p-channel transistor path comprises a p-channel transistor having a control input coupled to the data node Q, wherein the first n-channel transistor path comprises a n-channel transistor having a control input coupled to the data complement node QN, wherein the second p-channel transistor path comprises a p-channel transistor having a control input coupled to the data complement node QN, and wherein the second n-channel transistor path comprises a n-channel transistor having a control input coupled to the data node Q.

48. The hardening circuit of claim 47 wherein each of the transistors of the first and second p-channel transistor paths has a substrate region and a source region, and wherein the substrate and source regions of each corresponding transistor of the first and second p-channel transistor paths are coupled together, and wherein the source is the clock input side of the transistor and the source regions of the transistors in the first and second p-channel transistor paths are coupled to a clock input.

49. The hardening circuit of claim 47 wherein each of the transistors of the first and second p-channel transistor paths has a substrate, and wherein the substrate of each of the transistors of the first and second p-channel transistor paths is coupled to the rail VDD.

50. The hardening circuit of claim 47 wherein each of the transistors of the first and second p-channel transistor paths has a substrate, and wherein the substrate of each of the transistors of the first and second p-channel transistor paths is floating.

51. The hardening system of claim 1 wherein the hardening circuit comprises:
a hardening transistor coupled to drive at least one of the data node Q and the data complement node QN;
a first transistor coupled to a gate of the hardening transistor; and,
a second transistor coupled to the gate of the hardening transistor, wherein one of the first and second transistors is an n-channel transistor, and wherein the other of the first and second transistors is a p-channel transistor.

52. The hardening system of claim 1 wherein the hardening circuit comprises:
a hardening transistor coupled to drive at least one of the data node Q and the data complement node QN; and,
first and second parallel transistor paths, wherein the first transistor path includes a first transistor, wherein the second transistor path includes a second transistor, wherein one of the first and second transistors is an n-channel transistor, and wherein the other of the first and second transistors is a p-channel transistor.

53. The hardening system of claim 11 wherein one of the first and second single transistors is an n-channel transistor, and wherein the other of the first and second single transistors is a p-channel transistor.

* * * * *